(12) United States Patent
Barth, Jr.

(10) Patent No.: US 7,286,425 B2
(45) Date of Patent: Oct. 23, 2007

(54) SYSTEM AND METHOD FOR CAPACITIVE MIS-MATCH BIT-LINE SENSING

(75) Inventor: John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/163,800

(22) Filed: Oct. 31, 2005

(65) Prior Publication Data

US 2007/0097768 A1    May 3, 2007

(51) Int. Cl.
*G11C 7/00*    (2006.01)
(52) U.S. Cl. .................. 365/205; 365/190; 365/149
(58) Field of Classification Search .................. 365/205
See application file for complete search history.

(56) References Cited

U.S. PATENT DOCUMENTS

| | | | |
|---|---|---|---|
| 3,931,538 A | | 1/1976 | Itoh et al. |
| 4,649,301 A | | 3/1987 | Tran |
| 4,792,922 A | * | 12/1988 | Mimoto et al. .............. 365/149 |
| 4,816,706 A | | 3/1989 | Dhong et al. |
| 5,241,503 A | | 8/1993 | Cheng |
| 5,280,452 A | * | 1/1994 | Dhong et al. ................ 365/205 |
| 5,315,555 A | * | 5/1994 | Choi .......................... 365/207 |
| 5,367,481 A | * | 11/1994 | Takase et al. ................ 365/149 |
| 5,590,080 A | * | 12/1996 | Hasagawa et al. ........... 365/201 |
| 5,684,749 A | * | 11/1997 | Seyyedy et al. ............. 365/203 |
| 5,875,141 A | * | 2/1999 | Shirley et al. ............... 365/207 |
| 6,028,797 A | * | 2/2000 | Kim et al. ................... 365/190 |
| 6,122,211 A | * | 9/2000 | Morgan et al. .............. 365/205 |
| 6,246,604 B1 | * | 6/2001 | Lowrey ....................... 365/149 |
| 6,272,059 B1 | * | 8/2001 | Ryu et al. .................... 365/205 |
| 6,272,062 B1 | * | 8/2001 | Mueller et al. ........ 365/230.02 |
| 6,292,417 B1 | * | 9/2001 | Seyyedy ...................... 365/203 |
| 6,356,495 B2 | * | 3/2002 | Lowrey ....................... 365/203 |

(Continued)

FOREIGN PATENT DOCUMENTS

JP    4127478 A    4/1992

OTHER PUBLICATIONS

Barth, John E. Jr., et al. "Embedded DRAM design and archicture for the IBM 0.11-μm ASIC offering", IBM J Res & Dev. vol. 46 No. 6 Nov. 2002. 675-689.

(Continued)

*Primary Examiner*—Son L. Mai
(74) *Attorney, Agent, or Firm*—Michael J. Le Strange

(57) ABSTRACT

Dynamic random access memory (DRAM) sensing is accomplished by using capacitive mismatch between a bit line without a cell and a corresponding bit line with a cell to determine if a selected capacitor holds a one or a zero. Isolators on the bit lines are used to create the mismatch. In this manner, reference cells and bit-line twisting are eliminated, while maintaining rail pre-charge at VDD or ground. Utilizing short bit-lines, 'Zero' (for GND pre-charge) can be sensed by means of inherent capacitive mis-match. The zero will hold the bit-line at GND, the bit-line without a cell (or with fewer cells) will have less capacitance and rise faster than the bit-line with the cell due to capacitive mis-match. For sensing a 'one', the bit-line will have enough signal to overcome the capacitive mis-match.

20 Claims, 12 Drawing Sheets

U.S. PATENT DOCUMENTS

| | | |
|---|---|---|
| 6,560,137 B2 | 5/2003 | Allen et al. |
| 6,577,548 B1 | 6/2003 | Barth et al. |
| 6,608,772 B2 * | 8/2003 | Ooishi ........................ 365/63 |
| 2004/0120200 A1 | 6/2004 | Gogl et al. |
| 2004/0136253 A1 | 7/2004 | Gupta et al. |
| 2004/0164771 A1 | 8/2004 | Martin et al. |

OTHER PUBLICATIONS

Barth, John "DRAM Design Tutorial" afs/btv.ibm.com/data/a20/view2/frame/DRAM_Tutorial00,Apr. 7, 2000. 18 pages.

* cited by examiner

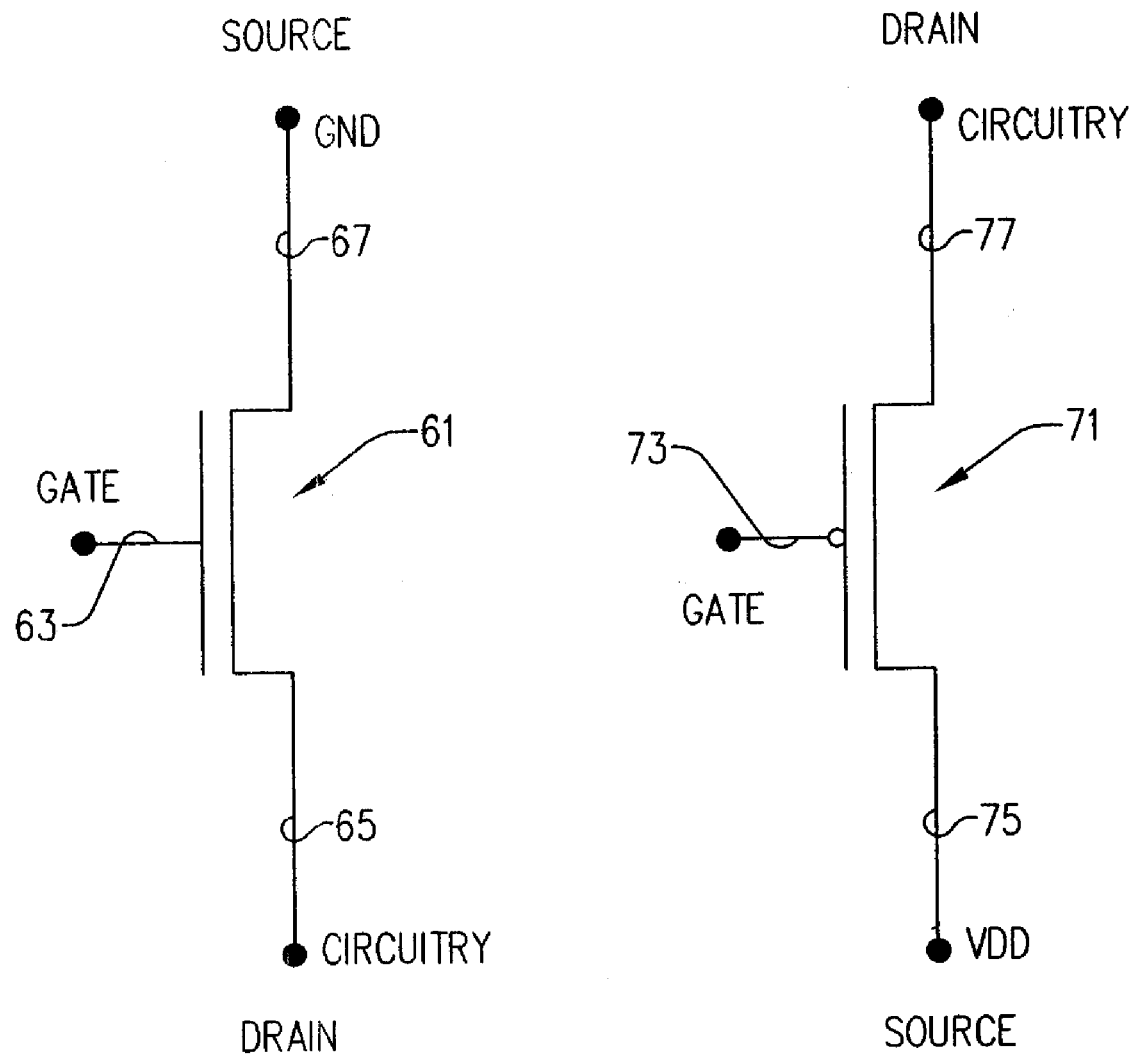

SHARED SENSE AMPLIFIER

PRIOR ART                      SHARRED SENSE AMP

CAPACITIVE MIS-MATCH SENSE AMP

CAPACITIVE MISMATCH

SYSTEM AND METHOD FOR CAPACITIVE MIS-MATCH BIT-LINE SENSING

BACKGROUND OF THE INVENTION

1. Technical Field of the Invention

This invention relates to dynamic random access memories (DRAM). More particularly, it relates to capacitive mis-match sensing of bit-lines in a DRAM.

2. Background Art

In the operation of DRAM (Dynamic Random Access Memory) devices, it is required to maintain data stored in a charge storage cell of an array for a maximum retention period without performing a refresh operation in order to offer high availability and low power consumption. When competing with Static RAM (SRAM) devices, it is also desirable to offer high performance with the same DRAM design.

In the current state of the art there are DRAM designs that offer either high retention times for the stored data or high performance.

A conventional DRAM sensing scheme is known as half-VDD sensing, in which both the true and complementary bit-lines are pre-charged to a value approximately halfway between a logic 1 voltage (VDD) and a logic 0 voltage (ground, or GND). When a cell is coupled to a pre-charged bit-line, the voltage will then slightly increase or decrease, depending on the value of the bit stored in the cell, thus creating a differential voltage with respect to the complementary bit-line and VDD/2.

However, for performance reasons, a ground sensing scheme pre-charges the bit-line pair to ground prior to a read operation. Because of the pre-charging to ground, reference word lines are needed to place a reference voltage (e.g., (Vread1-Vread0)/2) on either the bit-line or the complementary bit-line in order to be able to read a 0 bit.

Additionally, in order to reduce the effects of capacitance between adjacent bit-line pairs, a given bit-line pair is twisted at various locations along the length of the bit-line. Generally, even numbered bit-line pairs are twisted at different locations with respect to adjacent odd numbered bit-line pairs. For example, the even numbered bit-line pairs might be twisted just once at ½ of the total length, while the odd numbered pairs are twisted at ¼ of the total length, and again at ¾ of the total length.

Unfortunately, the use of bit-line twisting complicates the reference word-line schemes, in that reference cells for each region are required.

Both bit-line twisting and reference cells require area and adversely impact DRAM macro efficiency. Consequently, there is a need in the art for a a GND pre-charge scheme that does not require twisting or reference cells.

Referring to FIG. 1, under control of clock and control circuitry 88, a conventional mid-level sense amplifier system 58 pre-charge the bit-lines BTX and BCX to mid-level potentials VREFX, such as VDD/2, VDD/3, or VDD/X (where VDD is power supply voltage and X is a number greater than 1, and offer good retention times for the data stored in array 54. Rail sensing schemes pre-charge the true and complementary bit-lines BTX and BCX to VDD or ground (GND) and offer good performance. Data read from array 54 under control of clock and control 88 by sense amp 58 is typically stored to a local buffer 60 for transfer to digital circuits 62.

Both of the rail sensing (VDD or GND pre-charge) systems typically require reference cells that require area.

Referring to FIG. 2, an example of a CMOS negative field effect transistor (NFET) circuit 61 comprises a gate 63, a drain (connection to circuitry) 65, and a source (connection to ground) 67. In operation, as the voltage on gate 63 goes higher than the voltage on drain 65 by some threshold voltage, NFET 61 turns on, shorting source 67 to drain 65.

Referring to FIG. 3, an example of a CMOS positive field effect transistor (PFET) circuit 71 comprises a gate 73, a drain (connection to circuitry) 77, and source 75 to voltage VDD. In operation, as the voltage on gate 73 falls below the voltage on source 75 by some threshold voltage, PFET 71 turns on, shorting source 75 to drain 77.

Referring to FIG. 4, memory arrays 54 are composed of rows 40 and columns 42, and typically include one transistor 48 as a switch and one capacitor 50 as a storage element. A single cell 52 is accessed by decoding one row 40 and one column 42 in matrix 54. A row, or word-line, 44 connects storage capacitor 50 to columns, or bit-line 46, and storage capacitor 50 transfers charge to bit-line 46, thus altering bit-line voltage.

Referring to FIG. 5, a change in bit-line 46 voltage is amplified with a cross coupled sense amp 38, which compares bit-line voltage with a reference 47, such that (bit-line voltage)−(reference)=(signal). A positive signal amplifies to logical '1', and a negative signal amplifies to logical '0'. Differential voltage is amplified by a cross coupled pair of transistors N0, N1, connected as shown between bit-line (BL) 46 and reference voltage (BL-not) 47 and set node 56. When set node 56 voltage is less than [(V+ΔV)−Vtn1] (where Vtn1 is the threshold voltage of transistor N1) on BL 46, current will start to flow across transistor N1 from not-BL 47 to set node 56. This is referred to as "on-side conduction". When set node 56 voltage is less than [(V)−Vtn0] (where in Vtn0 is the threshold voltage of transistor N0), then current will start to flow from BL 46 to set node 56 across transistor N0. This is referred to as "off-side conduction". Off-side conduction is modulated by set speed and amount of signal, and complimentary X-couple pairs provide full CMOS levels on bit-line 46.

When one uses a GND sensing scheme during the pre-charge time, all the bit-lines of the DRAM array 54 are pre-charged to GND. Although a GND pre-charge sensing scheme can support a wider operating range and provides more overdrive during amplification and more pre-charge than conventional VDD/2 sensing, it has the problem that it consumes more power. When considering signal development, charge transfer does not begin until the word-line voltage is greater than the bit-line voltage by the amplitude of a threshold voltage (Vt). This is critical for a longer word-line that will have significant slew rate, e.g. a 1 Volt/nanosecond slew introduces an extra 750 picosecond delay for VDD/2 pre-charge (equal to about 1.5V). Although GND sense circuits require reference cells (1.5% 16 Megabyte area), they also offer static and dynamic bit-line balancing and provide an excellent interlock for sense amplifier timing generation. However, a GND pre-charge scheme suffers from the problem of degraded retention characteristics for a stored '1', where the drain to source voltage of the storage transistor is the worst case for leakage current through the storage transistor.

When one stores a data value of "1" on the storage node of a deep trench capacitor 50 of a memory cell 52, the drain-source voltage is at the level of the supply potential VDD. During the pre-charge mode, the leakage through the weak channel of the cell transistor 48 is strongly dependent on both the gate-source voltage 52 and the drain 46-source GND voltage. Therefore, in a GND sensing scheme, the retention characteristic for a data value of "1" is degraded.

Alternatively, if a VDD sensing scheme is employed for a DRAM, the data value of "0" data retention characteristic of a data value of "0" is degraded by a large degree of leakage. To compensate for such a large degree of leakage, more frequent refresh operations are needed, but frequent performance of a refresh operation has dual disadvantages. The first disadvantage is that data retention functions consume excessive power required to refresh the memory cell. The second disadvantage is that memory availability is degraded because it is inaccessible during the time consumed by performance of the increased number of refresh cycles.

Therefore, both of the above GND and VDD sensing schemes, which present the problem of high cell leakage during the pre-charge condition, are not suitable for low power applications, even if such schemes show better performance and design robustness regardless of power supply voltage.

Use of mid-level sensing such as VDD/2 or VDD/X (where X is a number greater than 1) provides better cell leakage characteristics. With a mid-level sensing scheme, the data retention characteristic of a data value of "1" is improved because the gate-source voltage of the cell transistor is negative. The degree of data retention of a data value of "0" is also better than that for a VDD sensing scheme because source-drain voltage of the cell transistor is dropped from VDD to (VDD−VDD/2 or VDD/X). Also, the degree of data retention of a data value of "0" is not an issue because another leakage source compensates for the cell channel leakage from the bit-line to the storage node of the storage capacitor. Although mid-level sensing offers better retention characteristics, performance thereof falls short of objectives.

Barth et al. (hereinafter, Barth) discovered and described in U.S. patent application Ser. No. 10/906,471, filed 22 Feb. 2005, entitled "Bi-Mode Sense Amplifier With Dual Utilization of the Reference Cells and Dual Pre-charge Scheme for Improving Data Retention Time," that a solution to this problem is to retain the benefits of each of the above-described sensing schemes.

Accordingly, the Barth invention employs hybrid pre charge schemes wherein a bit-line level is switched from mid-level during a self-refresh, data retention mode of operation to a GND or a VDD sensing scheme during a mission mode of operation. Thus, Barth describes a dual pre-charge scheme including two operation modes which are the mission mode and the data retention mode. The mission mode is a real data access mode. The data retention mode is just to keep the data without sending or receiving data while running as a low power mode. The bit-line pre-charge level during the mission mode of operation is the same as required for the sensing scheme regardless of pre-charge or active mode. However, during the self-refresh, data retention mode, the bit-line pre-charge level is maintained around VDD/X (VREFX), making the gate-source voltage (VDD/X) and reducing the voltage drop across the cell transistor 48.

Sense amplifiers are described in J. E. Barth et al. "Embedded DRAM design and architecture for the IBM 0.11-m ASIC offering" IBM J. RES. & DEV. VOL. 46 NO. 6 pages 675-689 (November 2002).

Noise phenomenon include external noise (wire or Sx), and line to line coupling.

Referring to FIG. 6, external noise at sense amp 38 is reduced to common mode by folding BL 46 with respect to not-BL 47.

Referring to FIG. 7, line to line coupling is limited by bit-line twisting of bit-lines A 81, B 83, with respect to not-A 82 and not-B 84, respectively, as is represented at 80, 85, and 86, such that bit-line A 81 couples equally into bit-line B 83 and not-B line 84. Other forms of noise are introduced by local process variations which effectively degrades signals, Vt and )L mis-match, which is limited by longer channel length, overlay mis-alignment, which is limited by identical orientation, and capacitive mis-match, which is limited by careful physical design (symmetry).

Referring to FIGS. 8 and 9, in a conventional DRAM array of N cells, even word-lines couple N/2 cells to a true bit-line (BTx) 100, 122, and odd word-lines couple N/2 cells to a complementary bit-line (BCx) 102, 124. Isolation devices, controlled by ISO0 106 and ISO1 118, allow for sense amps 58 to be shared between upper 51 and lower 53 arrays.

Equalize phase (EQP0, EQP1) 104, 120 control the pre-charge of the bit lines BT0, BC0, BT1, and BC1.

Isolator gates (ISO0, ISO1) 106, 118 selectively isolate bit lines from amplifier 94, with unselected bit lines being isolated.

Equalize phase (EQP) 114 control the pre-charge of the sense amplifier 58.

Set N signal (SETN) 116 energize a set node signal, which is the common node for the cross coupled amplifier 94.

Column select, or bit switch, (BSN) 108 is a column multiplexor gating the data from sense amplifier 58 to the local buffers 60 via the data path FT 110 and FC 112.

Table 1 shows the state of the ISO and EQP signals of FIGS. 8 and 9 for various operations.

TABLE 1

| CONVENTIONAL ISO/EQP OPERATION | | | | |
|---|---|---|---|---|
| | ISO0 | EQP0 | ISO1 | EQP1 |
| Pre-Charge | X | 1 | X | 1 |
| Activate Upper | 1 | 0 | 0 | X |
| Activate Lower | 0 | X | 1 | 0 |

Clock and control circuitry 88 provides timing and control signals to sense amplifier 58, including EQP0 104, ISO0 106, EQP 114, set node (SETN) 116, BSN 108, ISO1 118 AND EQP1 120. Data read from arrays 51, 53 is written to local buffer 60 for transfer to digital circuitry 62 (FIG. 1).

Sense amplifier 58 includes several functional components, including upper array isolate and pre-charge 90, column decode 91, pre-charge 92, set device 93, cross coupled sense amplifier 94, and lower array isolate and pre-charge 95.

Referring to FIG. 9, upper array isolate and pre-charge 90 includes NFET devices 130, 132, 134, and 136. True bit-line BT0 100 is connected to the drains of NFETs 130 and 134, complementary bit-line BC0 102 is connected to the drains of NFETs 132 and 136. The sources of NFETs 130 and 132 are connected to ground. EQP0 104 is connected to the gates NFETs 130 and 132, and ISO0 106 is connected to the gates of NFETs 134 and 136.

Column decode 91 includes PFETs 140 and 142, with their gates connected to BSN 108. The drain of PFET 140 is connected by line 301 to the source of NFET 134 and the drain of PFET 142 is connected by line 307 to the source of NFET 136. The sources of PFETs 140 and 142 are connected to local buffer 60 via nodes FT 110 and FC 112, respectively.

Pre-charge 92 includes NFETs 144, 146, and 148. The sources of NFETs 144 and 148 are connected to ground, and their drains to the source of NFET 134 on line 301 and NFET 136 on line 307, respectively. NFET 146 is coupled between the drains of NFETs 144 and 148 at x and y, respectively. EQP 114 is connected to the gates of NFETs 144, 146, 148.

Set device 93 includes PFET 150 and NFET 152. The source of PFET 150 is connected to logic voltage level VDD, source of NFET 152 is connected to ground, and their drains are coupled together by line 305. SETN 116 gates PFET 150 and EQP gates NFET 152.

Cross coupled sense amp 94 includes PFET devices 160 and 162 and NFET devices 164 and 166. The sources of PFETs 160 are connected to line 305 at the coupled drains of FET devices 150, 152. The sources of NFETs 164 and 166 are connected to ground. The drains of FET devices 160 and 164 are connected via line 301 to the sources of NFETs 134 and 170 and to the gates of FET devices 162 and 166. The drains of FET devices 162 and 166 are connected by line 307 to the sources of NFETs 136 and 172 and to the gates of FET devices 160 and 164.

Lower array isolate and pre-charge 95 includes NFET devices 170, 172, 174, and 176. The source of NFET 170 is connected by line 301 to the source of NFET 134, and to the drains of FET devices 140, 144, 160, 164, to the gates of FET devices 162, 166, and to node X of NFET 146. The drain of NFET 170 is connected to the drain of NFET 174 and true bit-line BT1 122 to the lower array 53. The source of NFET 172 is connected by line 307 to the source of NFET 136 and to the drains of FET devices 142, 148, 162, 166, to the gates of FETs 160, 164, and to node Y of NFET 146. The drain of NFET 172 is connected to the drain of NFET 176 and complemen bit-line BC1 124 to the lower array 53. The sources of NFETs 174 and 176 are connected to ground. IS01 118 gates NFETs 170 and 172, and EQP1 120 gates NFETs 174 and 176.

Referring to FIG. 10, in operation sense amplifier system 58 in step 180 starts in the pre-charge state where EQP 104, EQP0 114 and EQP1 120 are held high by control circuitry 88. SETN 116 is held inactive in the high state, and isolation gates ISO0 106 and IS01 118 held low. Column select BSN 108 is held inactive in the high state.

In step 182, the first part of activation is to take amplifier 58 out of pre-charge by lowering EQP 114 and one of EQP0 OR EQP1, controlled by a high order address. The falling edge of EQP 114 turns off FETs 144, 146, 148, 152.

In step 184, the second part of activation is to address one of arrays 51 or 53 and taken it out of pre-charge. This is done, for example for the top array 51, by taking EQP0 low, turning off FETs 130 and 132, and simultaneously activating ISO0 106 to turn on FETs 134 and 136.

Continuing with respect to top array 51 (as is shown by Table 1, the operation for lower array 53 is analogous), in step 186 a word and a reference word are activated in upper array, developing differential signals on nodes BT0 100 and BC0 102. That differential signal is passed through NFETs 134 and 136 to bit-line nodes ST 301 and SC 307.

In step 188, the differential signal at nodes ST and SC is then amplified by activation of SETN 116 going low, turning on PFET 150. That will energize the cross coupled amplifier formed by FETs 160 162 164, 166. These will amplify the differential signal to a logic level VDD and in step 190 the result is transferred to digital circuits FT and FC via PFETs 140 and 142 upon activation of column select BSN 108.

In step 192, when the activation cycle of steps 186-190 is complete, the word line 52 in the selected array (in this case, array 51) is turned off, thus trapping the charge in the DRAM cell 52 (FIG. 4) of array 51.

In step 194, the amplifier system 58 is pre-charged by charging bit-lines BT0 100 and BC0 102 to ground via FETs 130, 132 upon the activation of EQP0 104. EQP 114 is also activated, thus returning the system to the pre-charge state of step 180.

SUMMARY OF THE INVENTION

A system for performing dynamic random access memory (DRAM) sensing by using isolator devices to provide capacitive mismatch between a bit line without a cell and a corresponding bit line with a cell to determine if a selected cell capacitor holds a one or a zero.

A system for performing dynamic random access memory (DRAM) sensing, comprising an array of DRAM storage cells; complementary bit lines from the array; and isolator devices on the bit lines for establishing capacitive mismatch between a short bit line and a corresponding long bit line to determine if a selected cell capacitor holds a one or a zero.

A system for performing dynamic random access memory (DRAM) sensing, comprising: an array of DRAM storage cells, each of the cell for storing one data bit, the array for generating from a selected cell a bit signal on a signal bit line; a sense amplifier system including an array isolation component, a column decode component, an amplifier pre-charge component, a set device component, and an amplifier component; the amplifier component including cross coupled pairs of FET devices for amplifying to a digital value a bit signal on a terminal of the amplifier component; the array isolation component for selectively isolating the array from the amplifier component and establishing capacitive mismatch across first and second terminals of the amplifier; the pre-charge component for pre-charging cross couple pairs of FET devices of the amplifier component to a pre-charge voltage level; the set device component for energizing selected cross couple pairs of the amplifier component; and the column decode component for gating a sensed bit from the amplifier component to digital circuitry.

A method for performing dynamic random access memory (DRAM) sensing by initializing a DRAM array to a precharge state; removing the sense amplifier from the precharge state; selecting and activating a bit line from an array of DRAM cells, with complementary bit lines configured by isolation devices to establish a capacitance mismatch between a true bit line and a corresponding complementary bit line; selecting and activating a word line of the array of DRAM cell to configure the isolation devices to gate a stored charge from a selected cell of the array on a selected bit lines to a first input terminal of a cross couple sense amplifier; operating the cross couple sense amplifier to generate a digital voltage signal from the stored charge; buffering the digital voltage signal to digital circuitry; reinforcing the stored charge in the selected cell; and returning the array to the precharge state.

Other features and advantages of this invention will become apparent from the following detailed description of the presently preferred embodiment of the invention, taken in conjunction with the accompanying drawings.

BRIEF DESCRIPTION OF THE DRAWINGS

FIG. 2 is a schematic representation of an N-type field effect transistor (NFET).

FIG. 3 is a schematic representation of a P-type field effect transistor (PFET).

FIGS. 1-10 are representations of prior art sense amplifier and related systems and components.

DETAILED DESCRIPTION OF THE BEST MODE

In accordance with the preferred embodiments of the invention, a system and method is provided for performing dynamic random access memory (DRAM) sensing by using isolator devices to provide capacitive mismatch between a bit line without a cell and a corresponding bit line with a cell to determine if a selected cell capacitor holds a one or a zero.

In this manner, reference cells and bit-line twisting are eliminated, while maintaining rail pre-charge at VDD or ground. Utilizing short bit-lines, 'Zero' (for GND pre-charge) can be sensed by means of inherent capacitive mis-match. The zero will hold the bit-line at GND, the bit-line without a cell (or with fewer cells) will have less capacitance and rise faster than the bit-line with the cell due to capacitive mis-match. For sensing a 'one', the bit-line will have enough signal to overcome the capacitive mis-match.

Ground sensing without reference cells cannot reliably read a zero. By utilizing a short bit line, a stored zero can be sensed with ground pre-charge by means of a capacitive mismatch, thus eliminating reference cells and bit line twisting. A short bit line is a bit-line with no or significantly fewer cells on it than a corresponding long bit line, resulting in much less capacitance.

Figure 11:
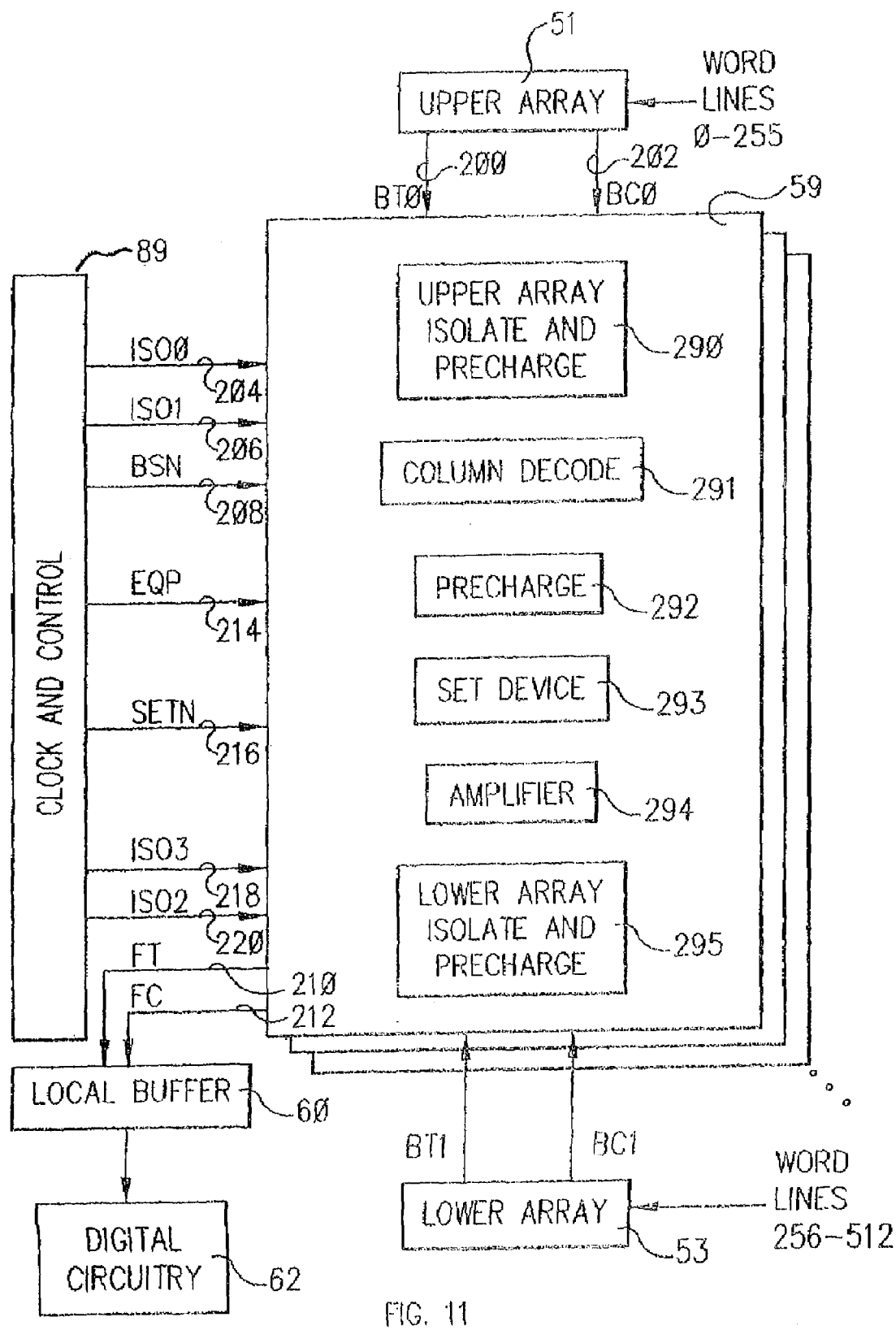
FIG. 11 is a high level schematic representation of a capacitive mis-match sense amplifier system in accordance with a preferred embodiment of the invention.

Referring to FIG. 11, in accordance with the preferred embodiment of the present invention, capacitive mis-match sense amplifier system 59, under control of clock and control circuitry 89, reads data from arrays 51 and 53 to a local buffer 60 for transfer to digital circuitry 62, and then refreshes and holds the data in cells of the arrays.

Control circuitry provides to system 59 reference signals including ISO0 204, IS01 206, BSN 208, EQP 214, SETN 216, ISO3 218, and ISO 2 220.

Isolation gate controls (ISO0) 204, ISO1 206, ISO 2 220, and ISO3 218 selectively isolate bit lines from amplifier 294, with unselected bit lines being isolated.

Equalize phase (EQP) 214 controls the pre-charge of the sense amplifier 59.

Set N signal (SETN) 216 energizes a set node signal, which is the common node for the cross coupled amplifier 294.

Column select, or bit switch, (BSN) 208 is a column multiplexer for gating data from sense amplifier 58 to the local buffers via a data path including FT and FC.

Sense amplifier system 59 includes several functional components, including upper array isolate and pre-charge 290, column decode 291, pre-charge 292, set device 293, amplifier 294, and lower array isolate and pre-charge 295. True bit-lines BT0 200, BT1 222 and complementary bit-lines BC0 202, BC1 224 are fed from upper 51 and lower 53 arrays to sense amplifier system 59. As shown in FIG. 11 (by the by the stack of sense amplifiers 59) in a typical system, several amplifier systems function together to load data from arrays 51, 53 to digital circuitry 62, as will be readily understood by those of skill in the art.

Upper array isolate and pre-charge 290 isolates the upper array 51 from sense amplifier 59.

Column decode 291 multiplexes a plurality of sense amps 59 to a single local buffer 60. Decode 291 selects which sense amp 59 data (bit) is transferred to the local buffer 60.

Pre-charge 292 pre-charges the cross coupled pairs in amplifier 294.

Set device 293 energizes the cross coupled pairs in amplifier 294.

Amplifier 294, using cross coupled pairs, amplifies a small bit signal from upper array or lower array to a digital value (VDD or GND).

Lower array isolate and pre-charge 295 isolates the lower array 53 from the sense amplifier 59.

Figure 12:
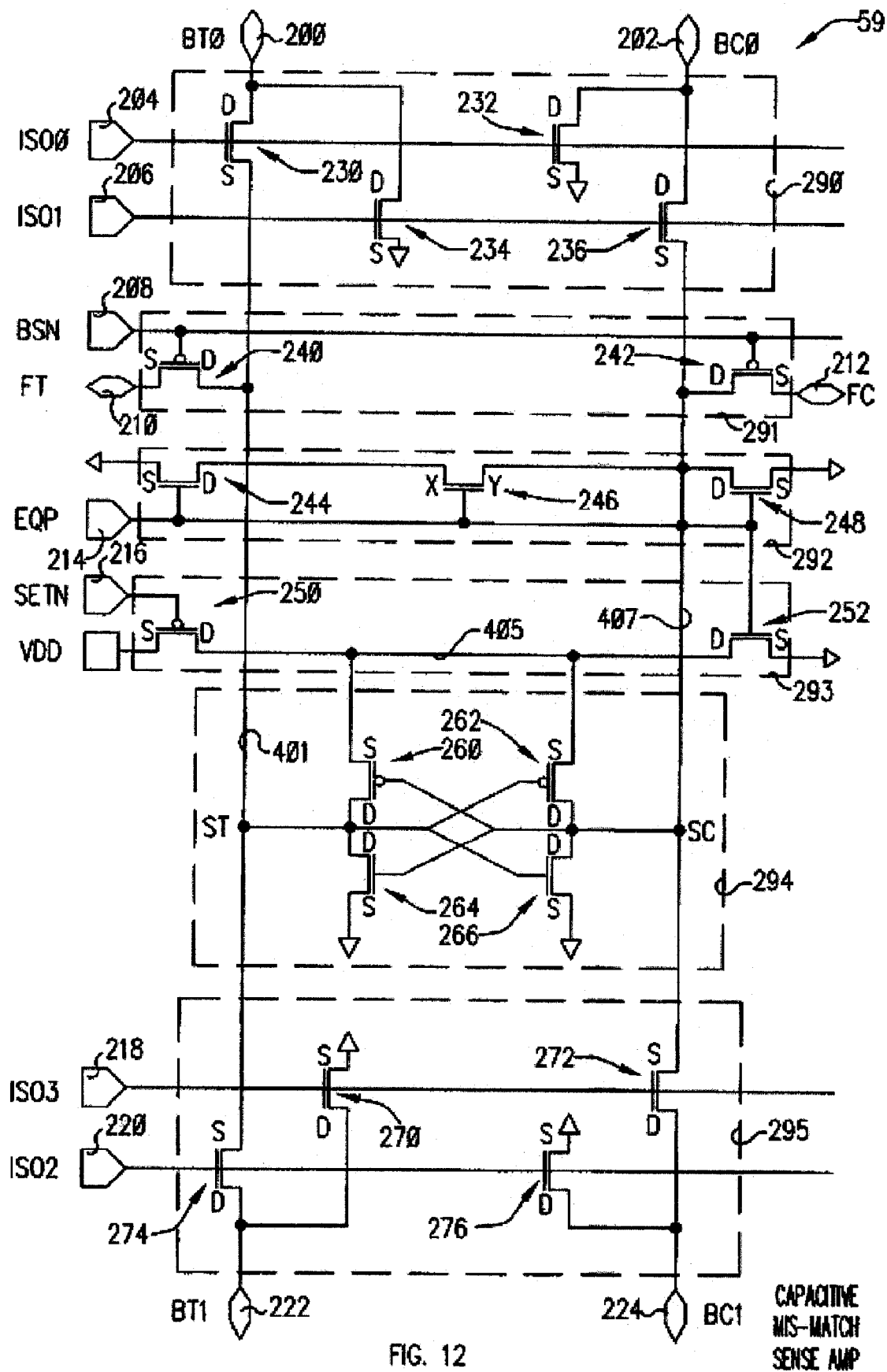
FIG. 12 is a more detailed schematic representation of the capacitive mis-match sense amplifier of FIG. 11.

While the preferred embodiment of FIGS. 11 and 12 provides for a plurality of arrays 51, 53, by eliminating lower array isolate and pre-charge 295 and lower array 53, a single array 51 configuration will result.

Referring to FIG. 12, upper array isolate and pre-charge 290 includes NFET devices 230, 232, 234 and 236. The drains of NFETs 230 and 234 are connected to true bit-line BT0 200, and the drains of NFETS 232 and 236 are connected to complementary bit-lines BC0 202. The sources of NFETs 232 and 234 are connected to ground, and the source of NFET 236 is connected to SC 407. The source NFET 230 is connected by node ST to the drains of FET devices 240, 244, 260, 264, to the gates of FET devices 262, 266, to the sources of NFET 274, and to node X of PFET 246.

Column decode 291 includes NFET devices 240, 242, both gated by BSN 208, and having their sources connected to local buffer 60 at nodes FT 210 and FC 212, respectively.

Pre-charge 292 includes NFET 244, 246 and 248, all gated by EQP 214. The sources of NFETs 244 and 248 are connected to ground, and NFET 246 is connected between the drains of NFETs 244 and 248 at nodes X and Y, respectively.

Set device 293 includes PFET 250 and NFET 252. PFET 250 is gated by SETN 216 and NFET 252 is gated by EQP 214. The source of NFET 252 is connected to ground, the source of PFET 250 is connected to voltage (VDD), and their drains are coupled by line 405 to each other and to the sources of PFET devices 260, 262.

Amplifier 294 includes cross coupled pairs of FET devices 260, 264, with their drains connected to node ST, and FET devices 262, 266, with their drains connected to node SC. These FET devices are cross coupled, with the drains of FETs 262, 266 connected node SC and to the gates of FETs 260, 264, and the drains of FETs 260, 264 connected to node ST and to the gates of FETs 262, 264.

Lower array isolate and pre-charge 295 includes NFET devices 270, 272, 274, and 276. As with NFET 236, the source of NFET 272 is connected to SC 407 The source of NFETs 270 and 276 are connected to ground. The drains of NFETs 270 and 274 are connected to true bit-line BT1 222, and the drains of NFETs 272 and 276 are connected to complementary bit-line BC1. NFETs 270 and 272 are gated by ISO3 218, and NFETs 274 and 276 are gated by ISO2 220.

Figure 1:
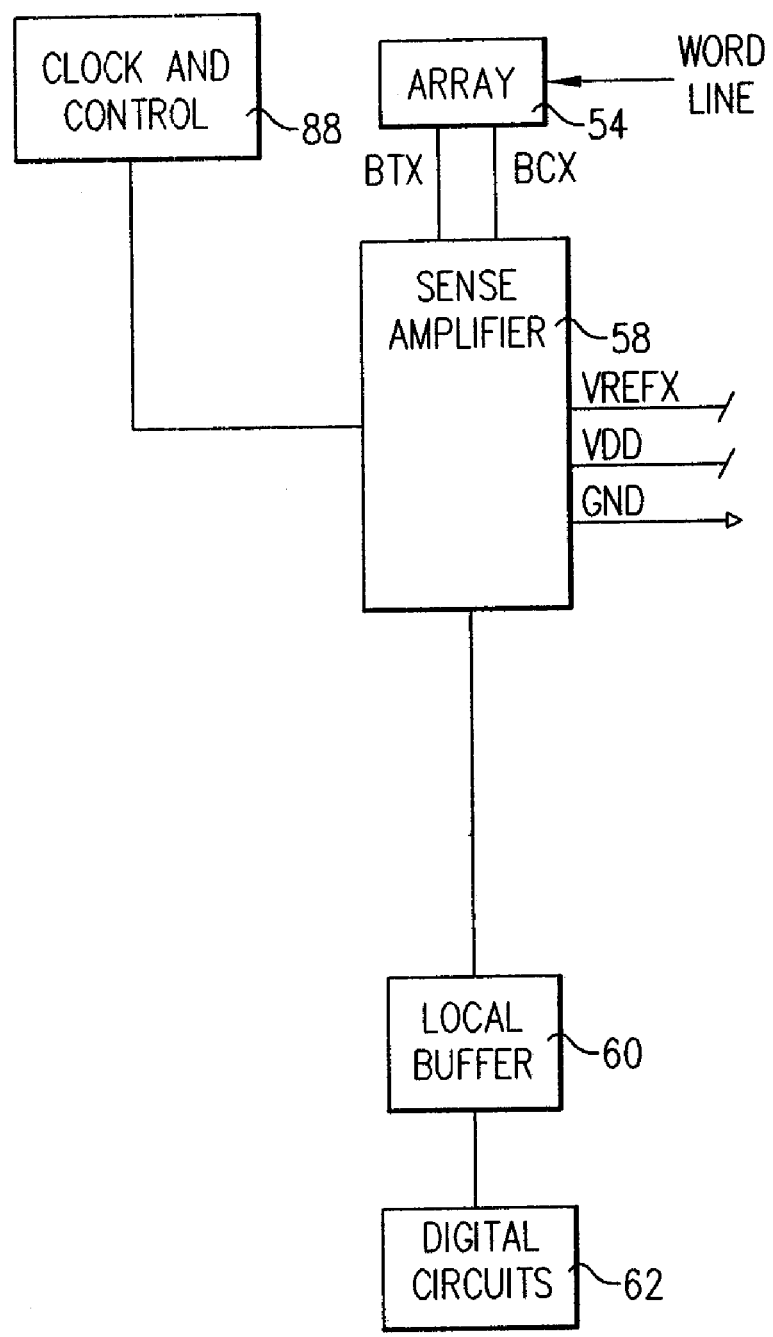
FIG. 1 is a high level diagram illustrating a sense amplifier system.
Figure 4:
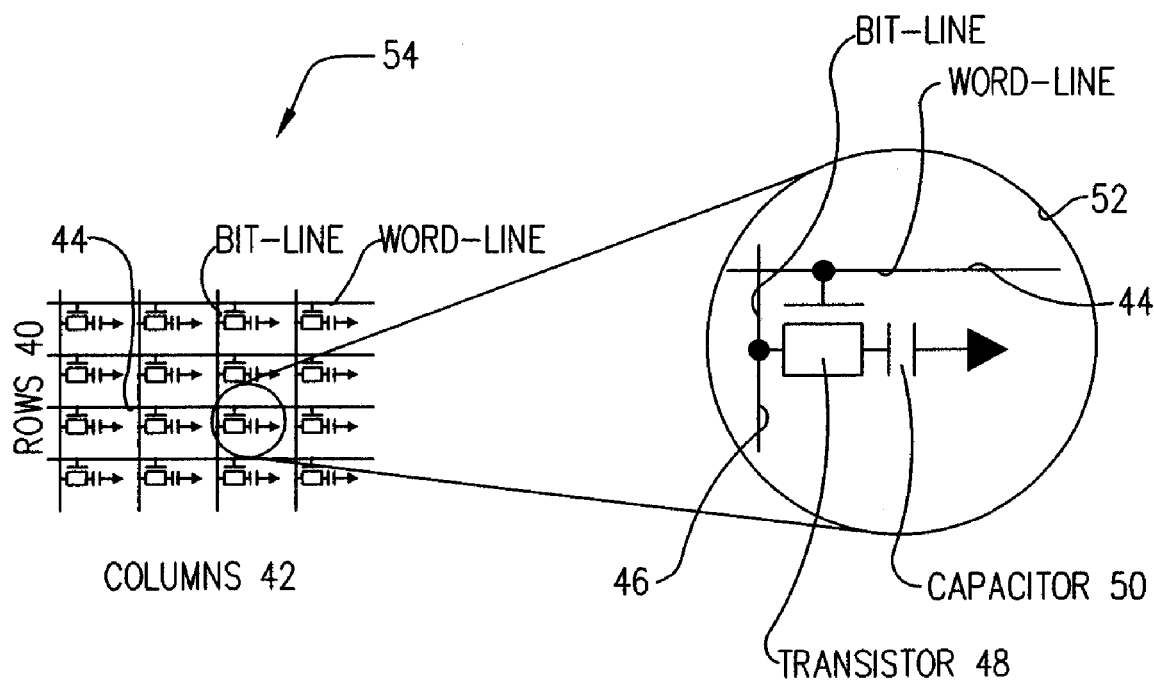
FIG. 4 is a schematic representation of an array of dynamic random access memory (DRAM) cells.
Figure 5:
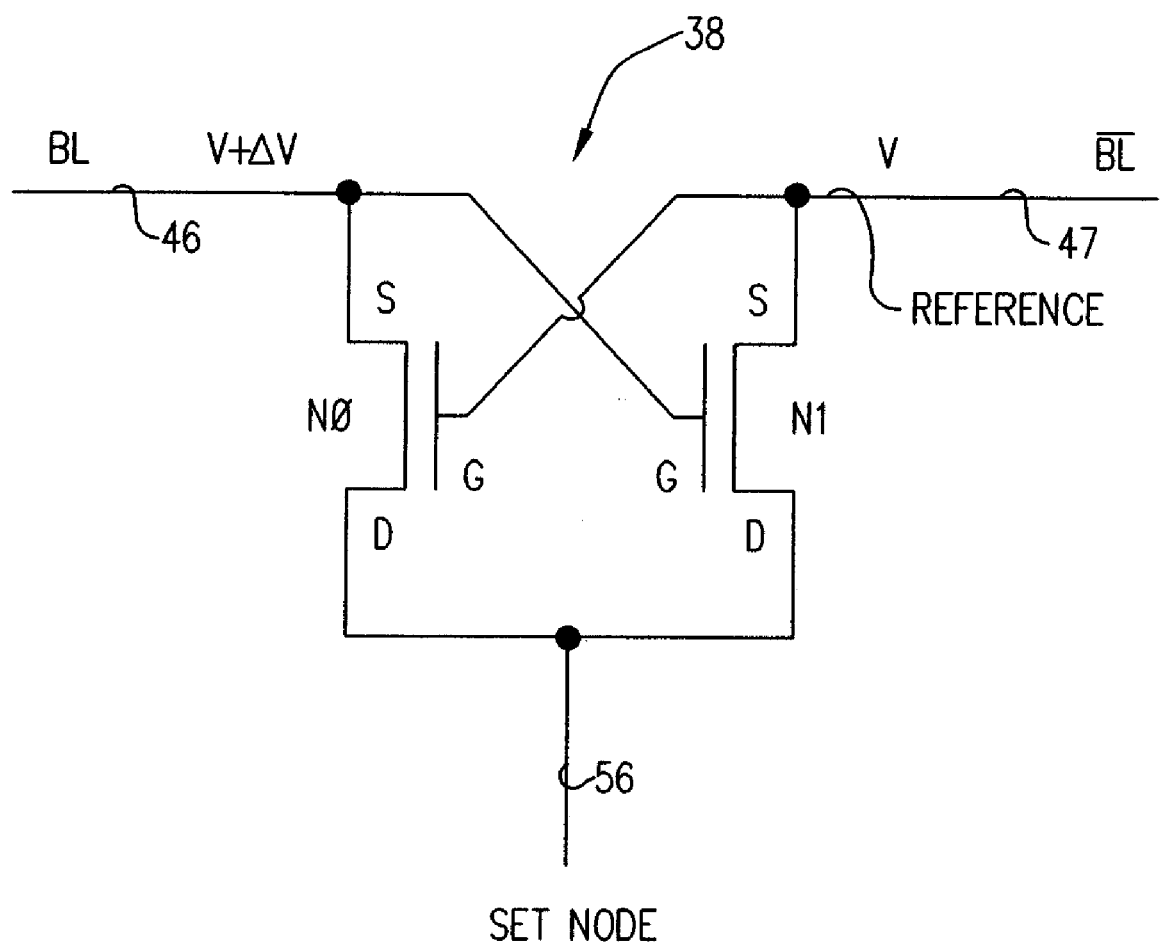
FIG. 5 is a schematic representation of a cross coupled sense amplifier.
Figure 6:
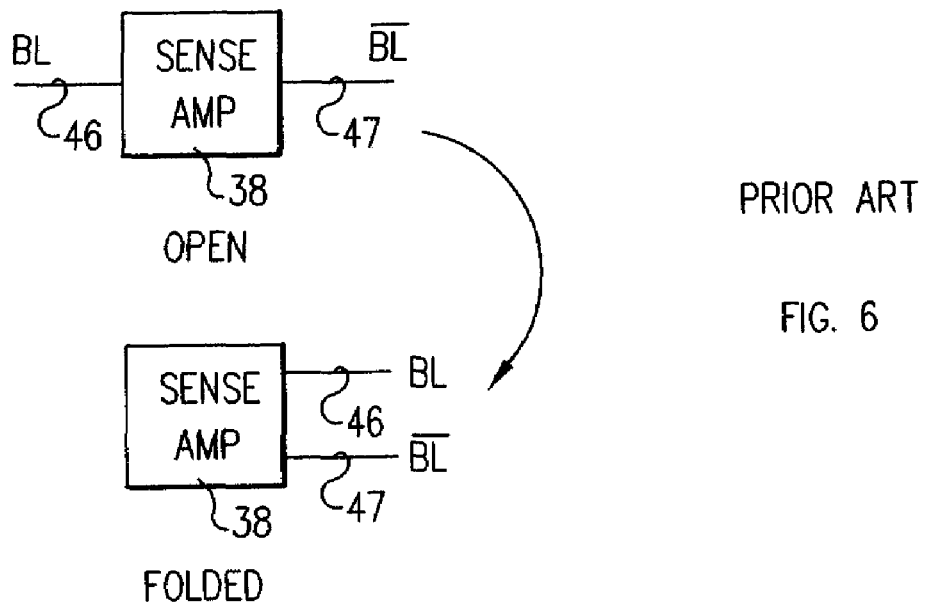
FIG. 6 is a schematic illustration of bit-line folding.
Figure 7:
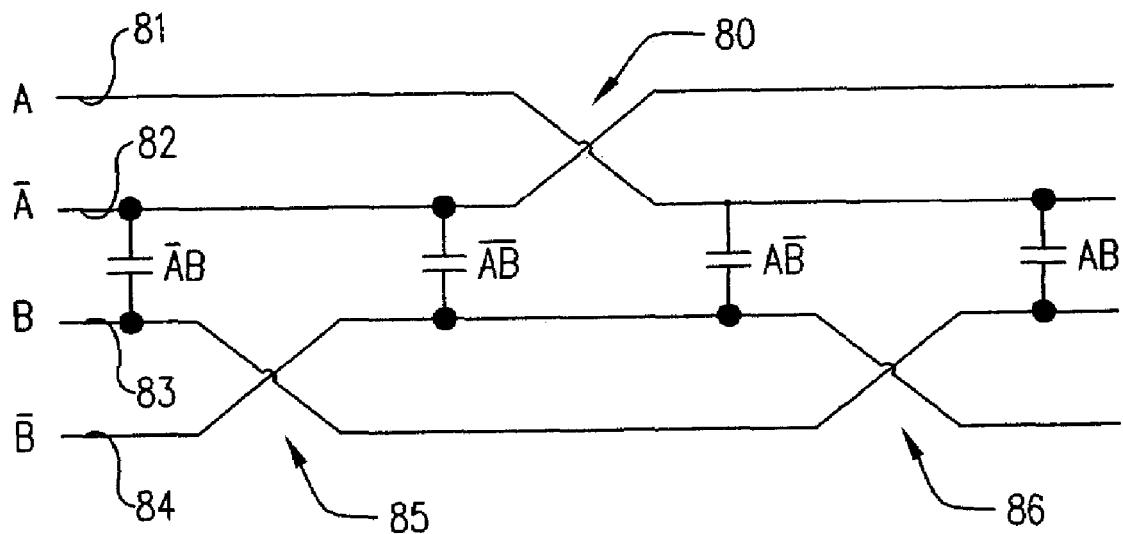
FIG. 7 is a schematic illustration of bit-line twisting to reduce line to line coupling.
Figure 8:
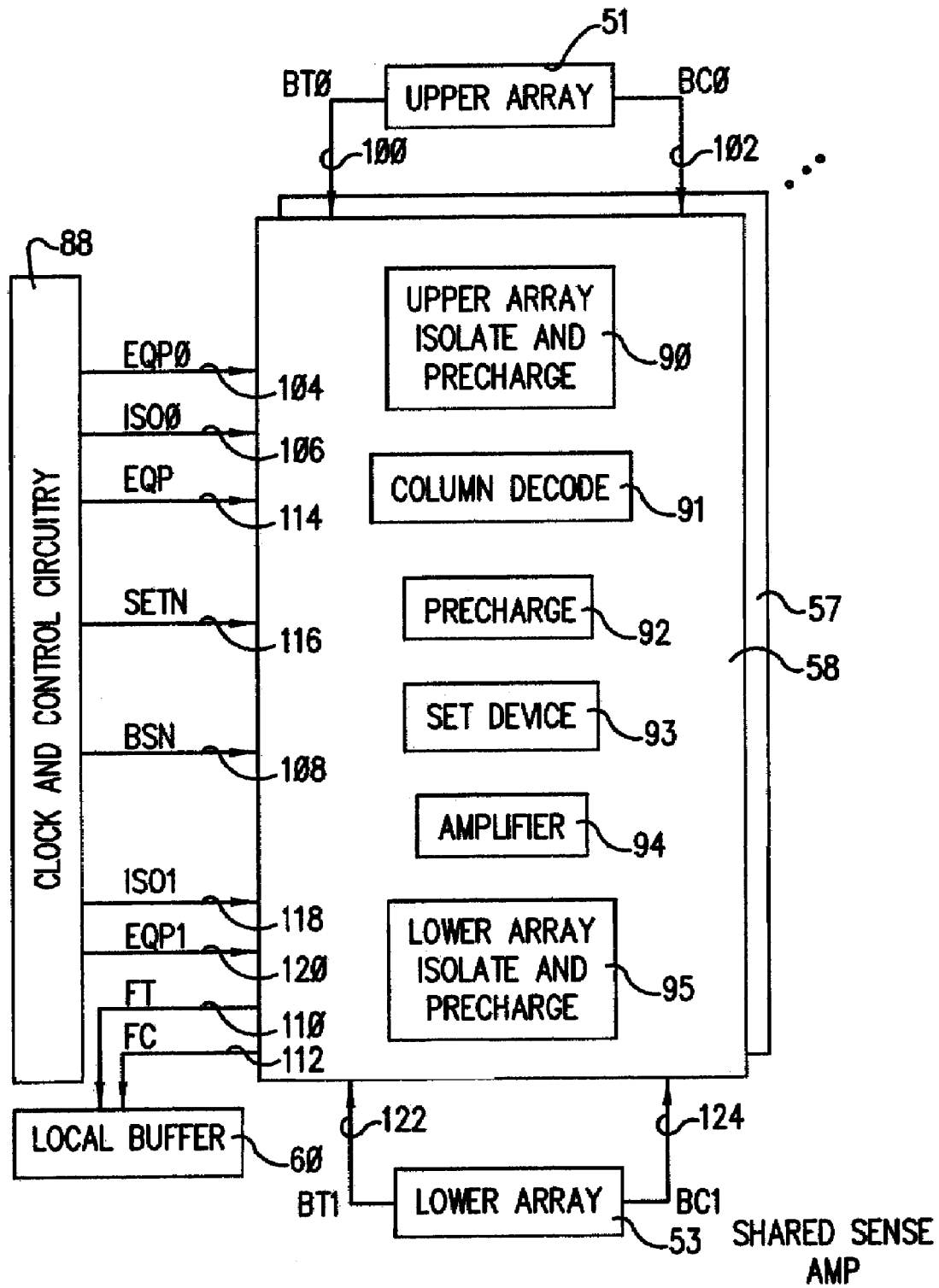
FIG. 8 is a high level schematic illustration of a shared sense amplifier system.

Referring further to FIG. 12, the bit lines are BTx and BCx. Terminal ST 401, upon ISO0 or ISO2 activation, becomes the long bit line, and SC 407 becoming the short (or less capacitive) bit line. Capacitive mismatch is created by coupling more bit cells 52 (FIG. 4) to ST than to SC. Terminal SC 407, upon ISO1 or ISO3 activation, becomes the long bit line, and ST 401 becoming the short (or less capacitive) bit line. Capacitive mismatch is created by coupling more bit cells 52 to SC than to ST (FIG. 4). In accordance with the preferred embodiments of the invention, capacitive mismatch is achieved through the use of isolator devices NFETs 230, 236, 272, and 274. When all of these isolator devices are turned off except for one, a bit line worth of cells is coupled to either ST 401 or SC 407 creating a capacitive mismatch in ST and SC.

If BC0 is selected for evaluation, truth table (Table 2) selects ISO1, which would be high, with the other ISOx control signals all low. Under this condition, all of the cells on BC0 are coupled to SC via NFET 236 and BT0 is held low via NFET 234 acting to shield neighboring lines and thus eliminating the need for bit line twisting. Thus, the sense amplifier circuits of the prior art (FIG. 9) are modified in this embodiment of the invention by reconfiguring the ISO controls 204, 206, 218, 220 on the gates in the array isolate and pre-charge components 290 and 295.

Figure 13:
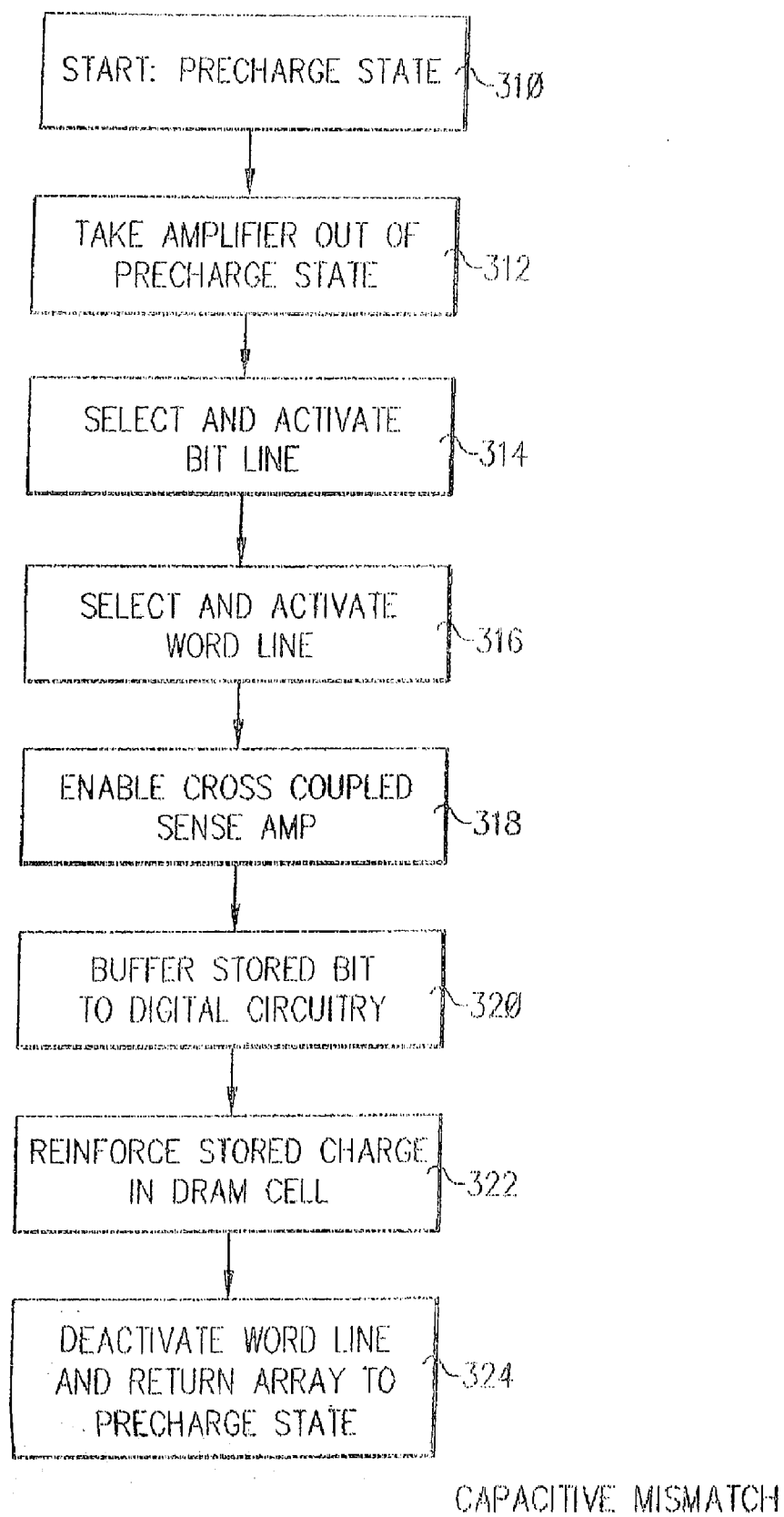
FIG. 13 is a flow chart representation of the operation of the capacitive mis-match sense amplifier system of FIG. 12.
Figure 14:
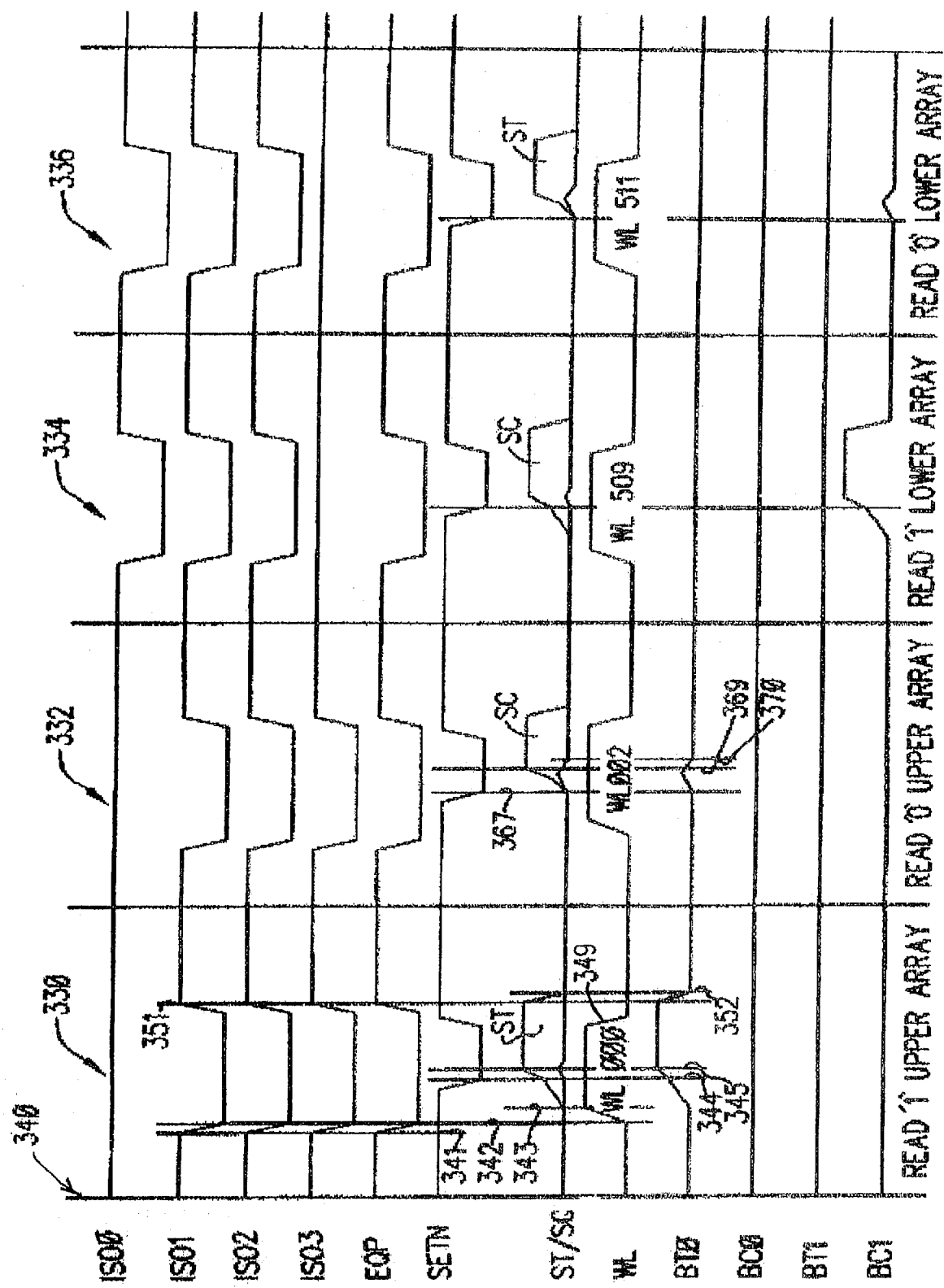
FIG. 14 is a timing diagram illustrating operation of the capacitive mis-match sense amplifier system of FIG. 12.

In operation, referring to FIG. 13 in connection with the logic diagram of FIG. 12 and the timing diagram of FIG. 14, in step 310 the system 59 starts each exemplary period 330 time 340 (and thereafter, starts periods 332, 334 and 336) in the pre-charge state: where EQP 214, ISO0 204, ISO1 206, ISO2 220, and ISO3 218 are held high by control circuitry 89. SETN 216 is held inactive in the high state. Column select BSN 208 is also held inactive in the high state.

In step 312, activation begins by taking amplifier 59 out of pre-charge at time 341 by lowing EQP. The falling edge of EQP 214 turns off FETS 244, 246, 248, 252.

In step 314, bit-lines are selected and activated. Isolation gates 230, 236, 272, and 274 in upper 290 and lower 295 array isolation components control which bit-line BT0 200, BC0 202, BT1 222 or BC1 224 will be activated based on a odd and even address, as set forth in Table 2 for upper and lower arrays.

In step 316, a word line is selected and activated. As is shown in Table 2, in the embodiment of FIG. 12, word lines 0-255 address upper array 51 and word lines 256-512 address lower array 53. An even row address, or word line, selects ISO0 or ISO2, and an odd row address selects ISO1 or ISO3.

TABLE 2

ISO CONTROL

|  |  | WL | ISO0 | ISO1 | ISO2 | ISO3 |
|---|---|---|---|---|---|---|
| Pre-Charge |  |  | 1 | 1 | 1 | 1 |
| Upper Array |  | Even | 1 | 0 | 0 | 0 |
|  |  | Odd | 0 | 1 | 0 | 0 |

TABLE 2-continued

ISO CONTROL

|  |  | WL | ISO0 | ISO1 | ISO2 | ISO3 |
|---|---|---|---|---|---|---|
| Lower Array |  | Even | 0 | 0 | 1 | 0 |
|  |  | Odd | 0 | 0 | 0 | 1 |

From Table 2, for an even row addressed in the upper array, ISO1, ISO2, and ISO3 will be deactivated (that is, driven low), as is illustrated occurring during period 330 from time 341 to 342. ISO1 going low, will turn off FET 234, floating the selected bit-line BT0 200. ISO0 which remains active (high) will keep FET 230 ON, passing any signal that is developed on BT0 200 (which is shown occurring from time 343 to 345) to node ST 401, and holds BC0 202 at ground via transistor 232 shielding noise from neighboring bit lines.

Referring to FIG. 14, four exemplary accesses to arrays are illustrated. During period 330, with word 'even' line 000 selected, a '1' is shown as being read out to bit node ST 401 from the upper array 151; during period 332 a '0', with 'even' word line 002 selected, is read out to bit node ST 401 from upper array 151; during period 334, with odd word line 509 selected, a '1' is shown as being read out to bit node SC 407 from lower array 53; and during period 336, with word line 511 selected, a '0' is read out from lower array 53 to bit node SC 407.

In the present example (Table 2, row 2, where an even row address in the upper array, results in ISO0 204 remaining on while ISO1 206, ISO2 220, and ISO3 218 are driven low, as is illustrated in period 330, time 341 to time 351), in step 316 a word line WL 44 (FIG. 4) in upper array 51 is activated. For the case of reading a stored '1' (as is shown in period 330), BT0 200 will rise as a function of the transfer ratio from time 343 to time 344, at which time, in step 318, the amplifier 294 is enabled by driving SETN 216 low (at time 344), thus turning on FET 250 and energizing cross coupled amplifier 294 FETs 260, 262, 264, and 266. ST 401 is high enough to turn on FET 266 holding bit node SC 407 at ground. SC 407 being held at ground reinforces ST 401 to a high level through FET 260 at time 345.

In step 320 of FIG. 13, the bit stored on ST 401 is buffered via node FT 210 to buffer 60.

In step 322 of FIG. 13, the amplified ST 401 signal is passed back through FET 230, reinforcing the stored charge in the DRAM cell 52 (FIG. 4) at time 345.

In step 324 of FIG. 13, word line 44 is deactivated at time 349, and the array is then returned to the pre-charge state of step 310, as is illustrated at time 351 to 352.

As is illustrated during period 332, to read a stored '0', for this example, in step 314 of FIG. 13, true bit BT0 200 is selected as previously described for reading a '1'. However, when reading a '0', there will be no charge transferred from dram cell to the true bit-line BT0 200. (Complementary bit BC0 is not in play here. In this preferred embodiment, which reads one bit-line at a time, a '1' or '0' bit is detected in upper array 51 by reference just to BT0 200 or BC0 202, but not to both.)

As a result, in step 318, amplifier 294 is energized at time 367 with a low going SETN signal 216 through FET 250. This creates an unstable cross coupled amplifier 294 because there is no differential signal between ST 401 and SC 407.

Thus, in accordance with the present invention, due to the capacitive mismatch, SC 407 will have less capacitance than ST 401 and will rise faster reaching a high level at time 369 before ST 401 reaches a high level. SC 407 will then turn on FET 264, driving ST 401 to ground at time 370 through FET 264. ST 401 going to ground at time 370 will drive SC to VDD through FETs 262 and 250.

In step 320 of FIG. 13, the '0' (GND) value on ST 401 is buffered via node FT 210 to local buffer 60.

In step 322 of FIG. 13, the low level ('0') on ST 401 will pass back through FET 230 to DRAM array cell 52, reinforcing the stored '0'.

Sense Amp Nodes ST 401 and SC 407 are significantly miss-matched in capacitance. When a stored '1' is read on to a bit-line 200, 202, 222, or 224, it passes through the selected isolator device onto ST. After signal development time, the amplifier is triggered with SETN 216 falling. If the stored '1' causes ST 401 to rise more than the threshold voltage of NFET 266, then SC will be held at GND by NFET 266, successfully reading '1'. When a stored '0' is read, ST 401 will not rise and the capacitance mis-match will cause SC 407 to rise faster than ST, successfully reading '0'.

Thus, a '1' value has been successfully read from the high array 51 in period 330, and a '0' value has been successfully read from high array 51 in period 332, both with respect to bit-line BT0. Bit-lines BC0, BT1 and BC1 are can be read in a similar manner by decoding by the row addresses shown in the truth table of Table 2.

Figure 9:
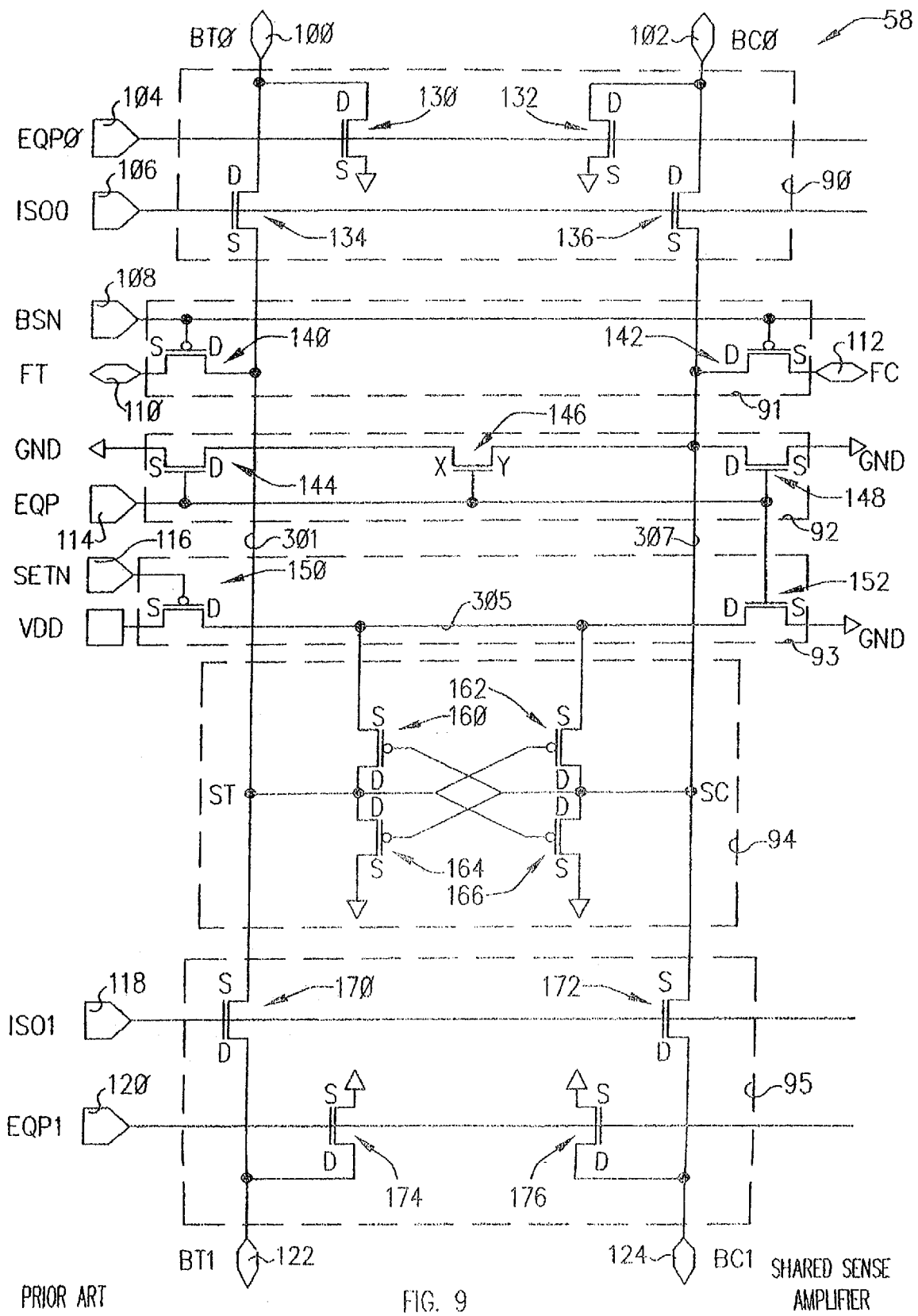
FIG. 9 is a more detailed representation of an embodiment of the shared sense amplifier system of FIG. 8.
Figure 10:
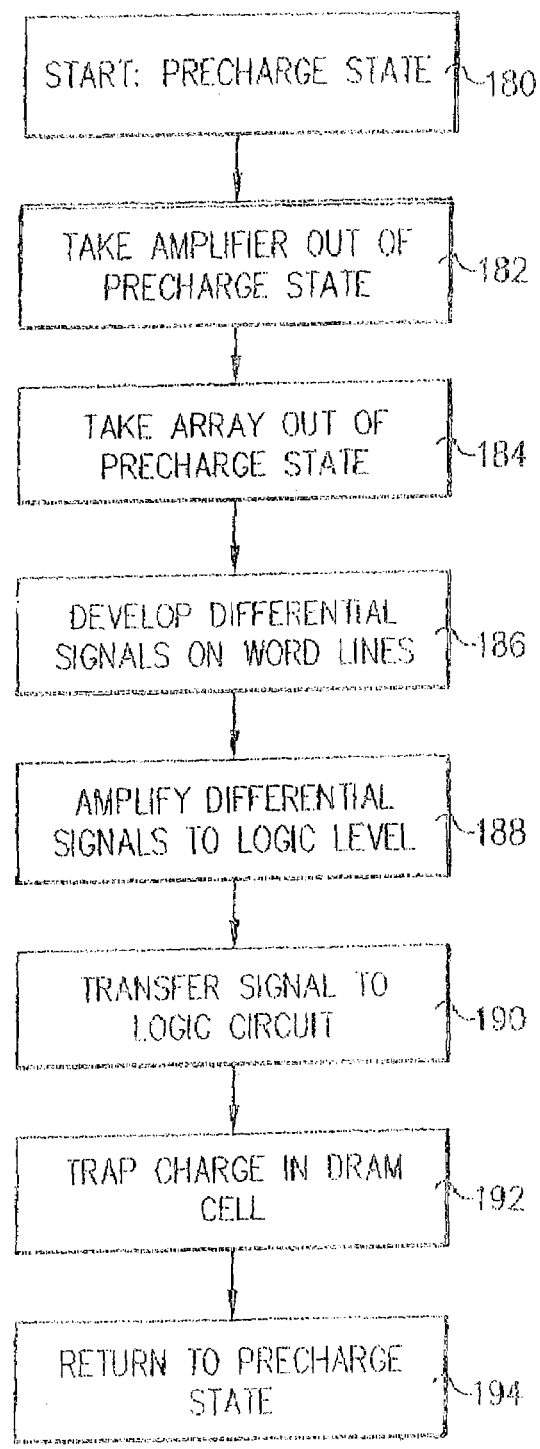
FIG. 10 is a flow chart representation of the operation of the shared sense amplifier system of FIG. 9.

Thus, utilizing short bit-lines, a stored '0' on a bit-line 200, 202, 222, or 224 is sensed by means of capacitive mis-match. Reference cells and bit-line twist are eliminated from the array. The sense amp of FIG. 9 is modified in FIG. 12 to use isolator devices to create capacitive sense amp mis-match. ISO gates ISO0 204, ISO1 206, ISO3 218, and ISO2 220 are controlled during pre-charge, bit sensing and refresh as shown in Table 2. Operation as such also enables true bit-lines BT0 200 and BT1 222 to act as shields during complement bit-line BC0 202, BC1 224 sensing and complement bit-lines to act as shields during true bit-line sensing. Thus, the preferred embodiment of the sense amplifier system presents an alternative to reference cells and twisting for GND pre-charge.

ADVANTAGES OVER THE PRIOR ART

The invention provides a system and method for DRAM sensing which avoids the necessity of bit-line twisting and reference cells which require area and adversely impact DRAM macro efficiency.

ALTERNATIVE EMBODIMENTS

In accordance with an alternative embodiment of the invention, with reference to FIG. 12, decreased capacitance mismatch may be achieved by coupling matching pairs of bit lines to a single sense amp terminal, a matching pair being two bit lines BT0 and BT1 or BC0 and BC1, one from the top array and one from the bottom array.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Accordingly, the scope of protection of this invention is limited only by the following claims and their equivalents.

What is claimed is:

1. A method for performing dynamic random access memory (DRAM) sensing, comprising
using isolator devices to establish capacitive mismatch between a short bit line and a corresponding long bit line to determine if a selected cell capacitor holds a one or a zero;
loading complementary bit signals to said short and long bit lines from a DRAM array;
said isolator devices selectively gating one of said short bit line and said long bit line to a first terminal of a cross coupled sense amplifier; and
operating said cross coupled sense amplifier to amplify to a digital voltage value a bit signal gated to said first terminal; and
selectively gating matching pairs of said bit lines, one from an upper array and one from a lower array, to said first terminal while holding all others of said bit lines to a pre-charge voltage state.

2. The method of claim 1, said isolator devices being field effect transistors and said DRAM array comprising an upper array and a lower array, each array having complementary short and long bit lines, and further comprising:
selectively gating one of said bit lines to said first terminal while holding all others of said bit lines to a pre-charge voltage state.

3. The method of claim 1, further comprising:
after a signal development time, triggering said cross coupled sense amplifier; and
operating said sense amplifier upon being triggered and responsive to said capacitance mis-match to read and amplify a data value on said first terminal selectively to ground and digital signal voltage.

4. A method for performing dynamic random access memory (DRAM) sensing, comprising:
initializing a DRAM array to a pre-charge state;
removing said sense amplifier from said pre-charge state;
selecting and activating a bit line from an array of DRAM cells, with complementary bit lines configured by isolation devices to establish a capacitance mis-match between a true bit line and a corresponding complementary bit line;

selecting and activating a word line of said array of DRAM cell to configure said isolation devices to gate a stored charge from a selected cell of said array on a selected bit lines to a first input terminal of a cross couple sense amplifier;
operating said cross couple sense amplifier to generate a digital voltage signal from said stored charge;
buffering said digital voltage signal to digital circuitry;
reinforcing said stored charge in said selected cell; and
returning said array to said pre-charge state.

5. The method of claim 4 said initializing further comprising operating control circuitry to hold a plurality of isolation gate controls active, with an isolation gate control for each said bit line, to hold a column select control signal inactive, and to hold inactive a SETN signal which, when active, enables the common node of said cross couple sense amplifier.

6. The method of claim 5, said removing further comprising operating said control circuitry to deactivate an equalize phase control signal at start of an activation stage to take said cross couple sense amplifier out of pre-charge.

7. The method of claim 6, further comprising:
said selecting and activating including selecting and activating one of said isolation gate controls to float one of said bit lines to pass to said first input terminal any signal derived from said selected cell.

8. The method of claim 7, further comprising:
configuring said isolation devices to establish a capacitance mis-match between said first input terminal and a second input terminal of said cross couple sense amplifier; and
triggering said cross couple sense amplifier after signal development time, and upon triggering detecting as a stored '1' value a signal on said first input terminal which rises above a threshold value of a first transistor device of said amplifier while said first transistor device holds said second input terminal at a second reference voltage and said first terminal is driven to a first reference voltage signifying a '1' digital value.

9. The method of claim 8, further comprising:
upon said triggering, driving said first terminal to said second reference voltage upon detecting as a '0' value a voltage on said first terminal which does not rise as quickly above said threshold value of said first transistor device as said second input terminal.

10. The method of claim 9, further comprising:
selectively gating matching pairs of said bit lines, one from said upper array and one from said lower array, to said first terminal while holding all others of said bit lines to a pre-charge voltage state.

11. A system for performing dynamic random access memory (DRAM) sensing, comprising:
an array of DRAM storage cells;
complementary bit lines from said array;
a cross coupled amplifier for amplifying to a digital voltage value a bit signal gated to a first terminal and loading said digital voltage value to digital circuitry;
isolator devices on said bit lines for establishing capacitive mismatch between a short bit line and a corresponding long bit line to determine if a selected cell capacitor holds a one or a zero, said isolator devices for establishing capacitive mismatch between said short and long bit lines by selectively gating one of said bit lines to said first terminal of said cross coupled amplifier while holding all other of said bit lines to a reference voltage;
at least one complementary pair of said short bit line and said long bit line; and
a controller for selectively gating matching pairs of said bit lines, one from an upper array and one from a lower array, to said first terminal while holding all others of said bit lines to a pre-charge voltage state.

12. The system of claim 11, further comprising:
said isolator devices being field effect transistors and said DRAM array comprising an upper array and a lower array, each said array having complementary short and long bit lines for connecting said array to said amplifier;
a controller for selectively gating one of said bit lines to said first terminal while holding all others of said bit lines to a pre-charge voltage state.

13. The system of claim 11, said controller further for triggering said cross coupled sense amplifier after a signal development time; and for operating said sense amplifier upon being triggered and responsive to said capacitance mis-match to read and amplify a data value on said first terminal selectively to ground and digital signal voltage.

14. A system for performing dynamic random access memory (DRAM) sensing, comprising:
an array of DRAM storage cells, each said cell for storing one data bit, said array for generating from a selected cell a bit signal on a signal bit line;
a sense amplifier system including an array isolation component, a column decode component, an amplifier pre-charge component, a set device component, and an amplifier component;
said amplifier component including cross coupled pairs of FET devices for amplifying to a digital value a bit signal on a terminal of said amplifier component;
said array isolation component for selectively isolating said array from said amplifier component and establishing capacitive mismatch across first and second terminals of said amplifier, said array isolation component being responsive to high order and low order addresses for activating a bit line from said array for sensing;
said pre-charge component for pre-charging cross couple pairs of FET devices of said amplifier component to a pre-charge voltage level, said pre-charge component being responsive to high order and low order addresses for activating a bit line from said array for sensing;
said set device component for energizing selected cross couple pairs of said amplifier component; and
said column decode component for gating a sensed bit from said amplifier component to digital circuitry.

15. The system of claim 14, said array further for generating from said selected cell a true bit signal on a true signal bit line and a complementary bit signal which is a complement of said true bit signal on a complementary signal bit line.

16. The system of claim 15, said array isolation component including:
a first transistor gated by a first isolation control signal for selectively isolating said true signal bit line from said first terminal of said amplifier component;
a second transistor gated by a second isolation control signal for selectively isolating said complementary signal bit line from said first terminal of said amplifier component;
a third transistor gated by said first isolation control signal for pre-charging said complementary signal bit line to a first voltage; and
a fourth transistor gated by said second isolation control signal for pre-charging said true signal bit line to said first voltage.

17. The system of claim 16, further comprising:
a clock and control module for selectively activating and deactivating said isolation control signals, with one of said isolation control signals remaining active and all others being deactivated during an activation period;

said first isolation control signal responsive to being deactivated for turning off said third transistor and floating said second transistor to pass any signal that is developed on said complementary signal bit line to said first terminal of said amplifier component; and said second isolation control signal responsive to being deactivated for turning off said fourth transistor and floating said first transistor to pass any signal that is developed on said true signal bit line to said first terminal of said amplifier component.

18. The system of claim 17, further comprising:

said clock and control module further for triggering said amplifier component following said activation period; and said amplifier component responsive to being triggered for selectively reading a stored '1' to said first terminal and a stored '0' to said second terminal.

19. The system of claim 18, further comprising a second array isolation component for selectively isolating a second array from said amplifier component and establishing capacitive mismatch across said first and second terminals of said amplifier;

said second array for generating from a second selected cell a true bit signal on a second true signal bit line and a second complementary bit signal which is a complement of said second true bit signal on a second complementary signal bit line;

said second array isolation component including:

a fifth transistor gated by a third isolation control signal for selectively isolating said second true signal bit line from said first terminal of said amplifier component;

a sixth transistor gated by a fourth isolation control signal for selectively isolating said second complementary signal bit line from said first terminal of said amplifier component;

a seventh transistor gated by said third isolation control signal for pre-charging said second complementary signal bit line to said first voltage; and a eighth transistor gated by said fourth isolation control signal for pre-charging said second true signal bit line to said first voltage.

20. The system of claim 19, further comprising:

said third isolation control signal responsive to being deactivated for turning off said seventh transistor and floating said sixth transistor to pass any signal that is developed on said second complementary signal bit line to said first terminal of said amplifier component; and said fourth isolation control signal responsive to being deactivated for turning off said eighth transistor and floating said fifth transistor to pass any signal that is developed on said second true signal bit line to said first terminal of said amplifier component.

* * * * *